United States Patent
Shimura

[11] Patent Number: 6,021,515
[45] Date of Patent: Feb. 1, 2000

[54] PATTERN GENERATOR FOR SEMICONDUCTOR TEST SYSTEM

[75] Inventor: Michio Shimura, Saitama, Japan

[73] Assignee: Advantest Corp., Tokyo, Japan

[21] Appl. No.: 08/835,601

[22] Filed: Apr. 9, 1997

[30] Foreign Application Priority Data

Apr. 19, 1996 [JP] Japan ................................ 8-122431

[51] Int. Cl.$^7$ ............................. G01R 31/28; G06F 11/00
[52] U.S. Cl. ............................................. 714/738; 714/32
[58] Field of Search ................................. 714/738, 739, 714/741, 742, 724, 728, 32, 33, 34; 364/933.8, 578, 580; 395/500

[56] References Cited

U.S. PATENT DOCUMENTS

| | | | |
|---|---|---|---|
| 4,583,041 | 4/1986 | Kimura | 714/735 |
| 5,029,171 | 7/1991 | Lee et al. | 714/744 |
| 5,432,797 | 7/1995 | Takano | 714/718 |

FOREIGN PATENT DOCUMENTS 8-248096   9/1996   Japan .

*Primary Examiner*—Trinh L. Tu
*Attorney, Agent, or Firm*—Muramatsu & Associates

[57] ABSTRACT

A pattern generator to be used in a semiconductor test system for testing a semiconductor device having function modules common to other semiconductor devices and specific function modules unique to the semiconductor device under test includes, a first pattern generation block for generating test patterns for testing the common function modules in the semiconductor device under test, a second pattern generation block for generating test patters for testing said specific function modules in the semiconductor device under test, and a pattern combine circuit which is connected to the outputs of the first and second pattern generation blocks and transmits the test patterns from either one of the first or second pattern generation block, wherein the first pattern generation block sends a start signal to the second pattern generation block to initiate the operation of generating the module specific test patterns, and the second pattern generation block sends an end signal to the first pattern generation block to initiate the operation of the first pattern generation block.

19 Claims, 15 Drawing Sheets

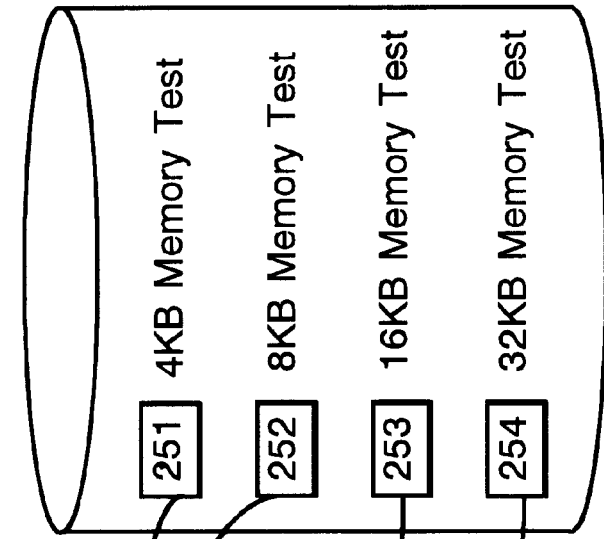
FIG.2C
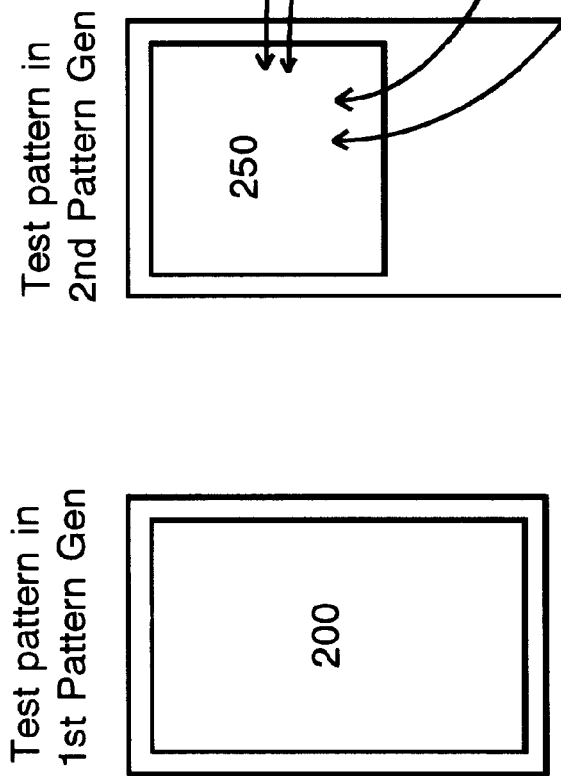
FIG.2B
FIG.2A

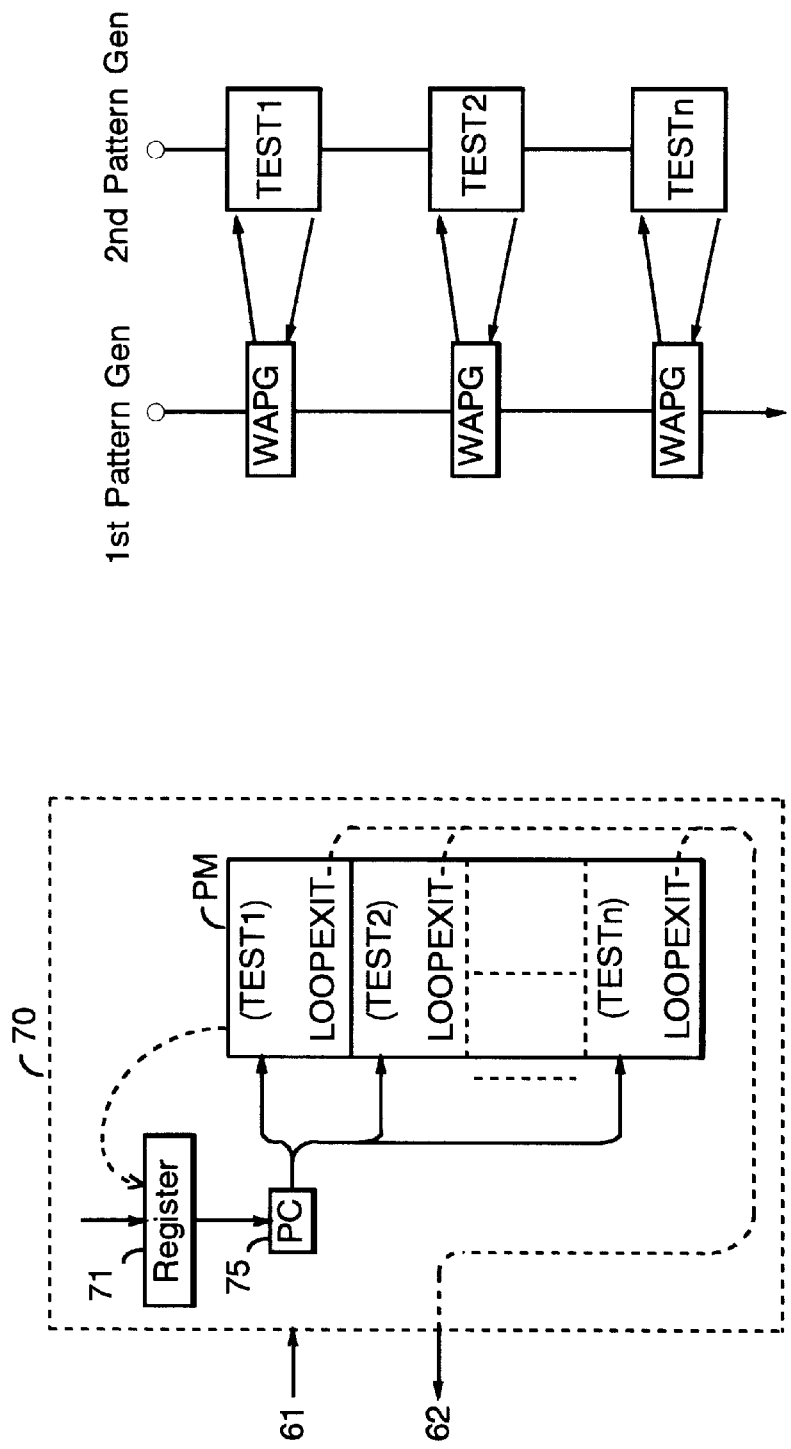

PATTERN GENERATOR FOR SEMICONDUCTOR TEST SYSTEM

FIELD OF THE INVENTION

This invention relates to a test pattern generator to be used in a semiconductor test system for testing semiconductor devices, and more particularly, to a test pattern generator which is capable of effectively sharing software resources produced for specific function modules and common function modules in semiconductor devices to be tested and decreasing the test cost and thus increasing the test efficiency in the semiconductor device testing.

BACKGROUND OF THE INVENTION

In testing semiconductor devices by a semiconductor test system, a test pattern must be produced for every new device under test (hereafter "DUT") to be supplied to the DUT. To produce a test pattern through a program, it is required a large amount of time and labor. In semiconductor devices having modern integrated circuit technologies, it has become common to include two or more function blocks or modules in a chip of the device such as an ASIC (Application Specific Integrated Circuit) device. For example, like a DUT 90 or a DUT 91 in FIG. 5, a semiconductor device includes a combination of modules 100 which are various types of function circuits.

Such modules and input/output terminals of the DUT are either directly connected without intervening circuits or indirectly connected through intermediate circuits. In an example of FIG. 6, a function module 100 in the DUT 90 is indirectly connected to the input/output terminals through an intermediate circuit 30. Examples of such intermediate circuits include a parallel-serial conversion circuit, a flip-flop circuit for clock synchronization, a level sensitive scan design (LSSD) circuit and a specific circuit controlled by a processor in the DUT.

In a situation where a function module in a device under test is connected to the input/output pins through an intermediate circuit, the test program formulated for the module can be commonly used even when a difference intermediate circuit is used without modifying the test program. This technology is shown in the Japanese Patent Application Serial No. 7-52432 owned by the same assignee of the present invention and a schematic diagram of which is shown in FIG. 6. The semiconductor test system 10 of FIG. 6 includes a pattern conversion means 20 which inversely converts the test pattern depending on the type of the intermediate circuit 30 in the DUT 90.

In the example of FIG. 6, the pattern conversion means 20 is provided between a pattern generator 11 and a wave formatter 12 and logic comparator 13. The pattern conversion means 20 includes, for example, conversion blocks 20A and 20B corresponding to the kinds of intermediate circuits in the device under test. Switches 21A and 21B are provided so that each of the conversion blocks is switchably inserted in the test system 10.

When the intermediate circuit is not included in the DUT 90, the test patterns from the pattern generator 11 are provided to the DUT 90 without being converted by the conversion means 20. When the intermediate circuit 30 is included in the DUT 90, the corresponding conversion block is selected by the switches 21A and 21B so that the converted test patterns are supplied to the DUT 90 through the wave formatter 12.

In this arrangement, even when a different intermediate circuit 30 is employed in the device under test, the same test pattern as produced for the module 100 can be commonly used for testing the DUT 90 having the module 100. Thus, by having the appropriate conversion blocks in the pattern conversion means 20, the same test pattern can be used even though the DUT includes variety of intermediate circuits so long as the type of the module 100 is identical.

However, some semiconductor devices such as an ASIC has a variety of combination of modules such as DUT 91–93 or DUT 94–96 shown in FIG. 8. In the example of FIG. 8A, each of the DUT 91–93 includes a core CPU and an I/O circuit which are identical to ones in the other DUTs. However, as to the memory modules, capacities of the first memory modules in the DUT 91–93 are different from one another, such as 4K byte, 8K byte or 16K byte.

In the example of FIG. 8B, each of the DUT 94–96 includes the core CPU and the I/O circuit which are the same with each other among the DUTs as in the example of FIG. 8A. As to the memory modules, in the DUT 94–96, although the capacities of the first memory modules are the same, i.e., 4K byte, the memory capacities of the second memory modules are different from one another, such as 128K byte, 256K byte or 512K byte.

Generally, In testing a memory, the different capacity of the memory requires a different test pattern because, for example, address sequence and pattern algorithm must match with the capacity of the memory. Therefore, to test the semiconductor devices having the variety of combination of the modules such as shown in FIG. 8, a large number of different test patterns must be prepared.

FIG. 7 shows an example of test pattern for testing a semiconductor device having modules common to the modules in the other semiconductor devices and other modules different from the modules in the other devices. In this example, the test pattern is formed of a test pattern block 200 and test pattern blocks 250. The test pattern block 200 is for the modules which are common among the devices to be tested and the test blocks 250 are for the modules which are different from device to device.

In testing the DUTs shown in FIG. 8, the test pattern is generated by reading the contents of the test pattern block 200 to test the common modules in the DUTs. At some point of the test pattern, a command signal "CALL" is read from the memory in the pattern generator so that the test pattern is generated by reading the contents of one of the test pattern blocks 250, such as a block 250a to test the module one type of memory module.

Since the test patterns 250a, 250b, ... 250n are dependent upon the type of modules included in the DUTs, many test patterns must be prepared for testing the DUT having various types of modules. In other words, each test pattern must include the test pattern block 200 for testing the common modules in the DUT and the test pattern blocks 250 for testing the specific modules in the DUT.

As in the foregoing, for testing semiconductor devices having variety of combinations of function modules therein, a large number of test pattern must be prepared corresponding to the combinations. For example, in FIGS. 7 and 8, one test pattern must have test blocks 200 and 250a, and another test pattern must have test blocks 200, 250a and 250b and 250n, and another test pattern must have test blocks 200, 250b and 250n, and so on. Therefore, to produce such a large number of test patterns requires a large amount of time and labor. Since the number of test programs is large, it is also necessary to suitably manage and stock the test programs, which also requires cost and human resources.

SUMMARY OF THE INVENTION

Therefore, it is an object of the present invention to provide a test pattern generator for semiconductor test system which is capable of having a plurality of pattern generation blocks for separately storing the common test pattern and the module specific test pattern.

It is another object of the present invention to provide a pattern generator for semiconductor test system which is capable of separately preparing module specific test patterns and combining the module specific test patterns depending on the combination of the function modules in the semiconductor device to be tested.

It is a further object of the present invention to provide a pattern generator for semiconductor test system which is capable of sequentially accessing a plurality of pattern generation blocks which separately store the common test pattern and the module specific test pattern.

It is a further object of the present invention to provide a pattern generator for semiconductor test system which is capable of minimizing the number of overall test patterns having the common test pattern and the module specific test pattern by arranging the common test pattern in a first pattern generation block and the module specific test patterns in a second pattern generation block based on the combination of function modules in the semiconductor device to be tested.

It is a further object of the present invention to provide a pattern generator for semiconductor test system which is capable of generating test patterns for testing a semiconductor device having modules which are common to other semiconductor devices and specific modules which are unique to the semiconductor device under test.

In a pattern generator of the present invention, the test patterns common to the semiconductor devices to be tested are stored in the first pattern generation block while the test patterns specific to the function modules different from device to device are separately stored in the second pattern generation blocks. Namely, the module specific test patterns can be loaded in the second pattern generation blocks based on the combination of the function modules included in the device to be tested and the test patterns are generated either one of the first or second pattern generation blocks.

In the first aspect of the present invention, the pattern generator to be used in a semiconductor test system for testing a semiconductor device having function modules common to other semiconductor devices and specific function modules unique to the semiconductor device under test includes, a first pattern generation means for generating test patterns for testing the common function modules in the semiconductor device under test, a second pattern generation means for generating test patters for testing the specific function modules in the semiconductor device under test, and a pattern combine circuit which is connected to the outputs of the first and second pattern generation means and transmits the test patterns from either one of the first or second pattern generation means, wherein the first pattern generation means sends a start signal to the second pattern generation means to initiate the operation of generating the module specific test patterns, and the second pattern generation means sends an end signal to the first pattern generation means to initiate the operation of the first pattern generation means.

The first pattern generation means suspends its operation after sending the start signal to the second pattern generation means. Conversely, the second pattern generation means suspend its operation after sending the end signal to the first pattern generation means.

The first pattern generation means includes a sequence control memory which stores instructions for controlling the test pattern generation, and a test and expected pattern memory which stores pattern data and expected data for generating the test pattern to be supplied to the device under test and expected pattern to be supplied to a logic comparator to compare the output signal of the device under test with the expected pattern. The sequence control memory stores an instruction for generating the start signal to be supplied to the second pattern generation means when a predetermined task of the first pattern generation means has been completed.

The second pattern generation means includes a sequence control memory which stores instructions for controlling the test pattern generation, and a test and expected pattern memory which stores pattern data and expected data for generating the test pattern to be supplied to the device under test and the expected pattern to be supplied to the logic comparator to compare the output signal of the device under test with the expected pattern. The sequence control memory stores an instruction for generating the end signal to be supplied to the first pattern generation means when a predetermined task of the second pattern generation means has been completed.

In the second aspect of the present invention, the pattern generator includes a common pattern generation means for generating test patterns for testing the common function modules in said semiconductor device under test, a plurality of specific pattern generation means for generating test patterns for testing the specific function modules in the semiconductor device under test, and a pattern combine circuit which is connected to the outputs of the common pattern generation means and the specific pattern generation means and transmits the test patterns from either one of the common pattern generation means or the plurality of specific pattern generation means, wherein the common pattern generation means sends a start signal to selected one of the specific pattern generation means to initiate the operation of generating the module specific test pattern by the selected specific pattern generation means, and the selected specific pattern generation means sends an end signal to the common pattern generation means to initiate the operation of the common pattern generation means.

In the further aspect of the present invention, the pattern generator includes a common pattern generation means for generating test patterns for testing the common function modules in the semiconductor device under test, a plurality of specific pattern generation means for generating test patterns for testing the specific function modules in the semiconductor device under test, a pattern combine circuit which is connected to the outputs of the common pattern generation means and the specific pattern generation means and transmits the test patterns from either one of the common pattern generation means or the plurality of specific pattern generation means, a selector provided between the common pattern generation means and the specific pattern generation means to selectively form a communication path between the common pattern generation means and one of the specific pattern generation means, and a register for supplying select data for defining the communication path by the selector, wherein the common pattern generation means sends a start signal to selected one of the specific pattern generation means through the communication path formed by the selector to initiate the operation of generating the module specific test pattern by the selected specific pattern generation means, and the selected specific pattern generation means sends an end signal to the common pattern generation means through the communication path formed by the selector to initiate the operation of the common pattern generation means.

According to the present invention, the pattern generator for the semiconductor test system has a plurality of pattern generation blocks for separately storing the common test pattern and the module specific test pattern in advance of the testing. In this arrangement, the pattern generator is able to separately prepare module specific test patterns and combine the module specific test patterns based on the combination of the function modules in the semiconductor device to be tested.

Further, the pattern generator of the present invention can sequentially access the plurality of pattern generation blocks which separately store the common test pattern and the module specific test pattern. Thus, the pattern generator is capable of minimizing the number of overall test patterns having the common test pattern and the module specific test pattern by arranging the common test pattern in the first pattern generation block and the module specific test patterns in the second pattern generation block based on the combination of function modules in the semiconductor device to be tested.

Moreover, since the test patterns can be prepared by combining the common test pattern and specific test patterns only when necessary, it is not necessary to produce a large number of complete test patterns requires for each type of device to be tested. Therefore, the present invention can save a large amount of time, cost and labor for producing the test pattern or managing the test programs.

BRIEF DESCRIPTION OF THE DRAWINGS

FIG. 2 is a schematic diagram showing test patterns loaded in a first pattern generation block (FIG. 2A) and a second pattern generation block (FIG. 2B) according to the present invention wherein FIG. 2C shows more detailed test patterns in the second pattern generation block.

FIG. 3 is a schematic diagram of the second pattern generation block of FIG. 1 of the present invention wherein an internal control structure thereof is shown in FIG. 3A and pattern generation sequence is shown in FIG. 3B.

DETAILED DESCRIPTION OF THE PREFERRED EMBODIMENT

Figure 1:
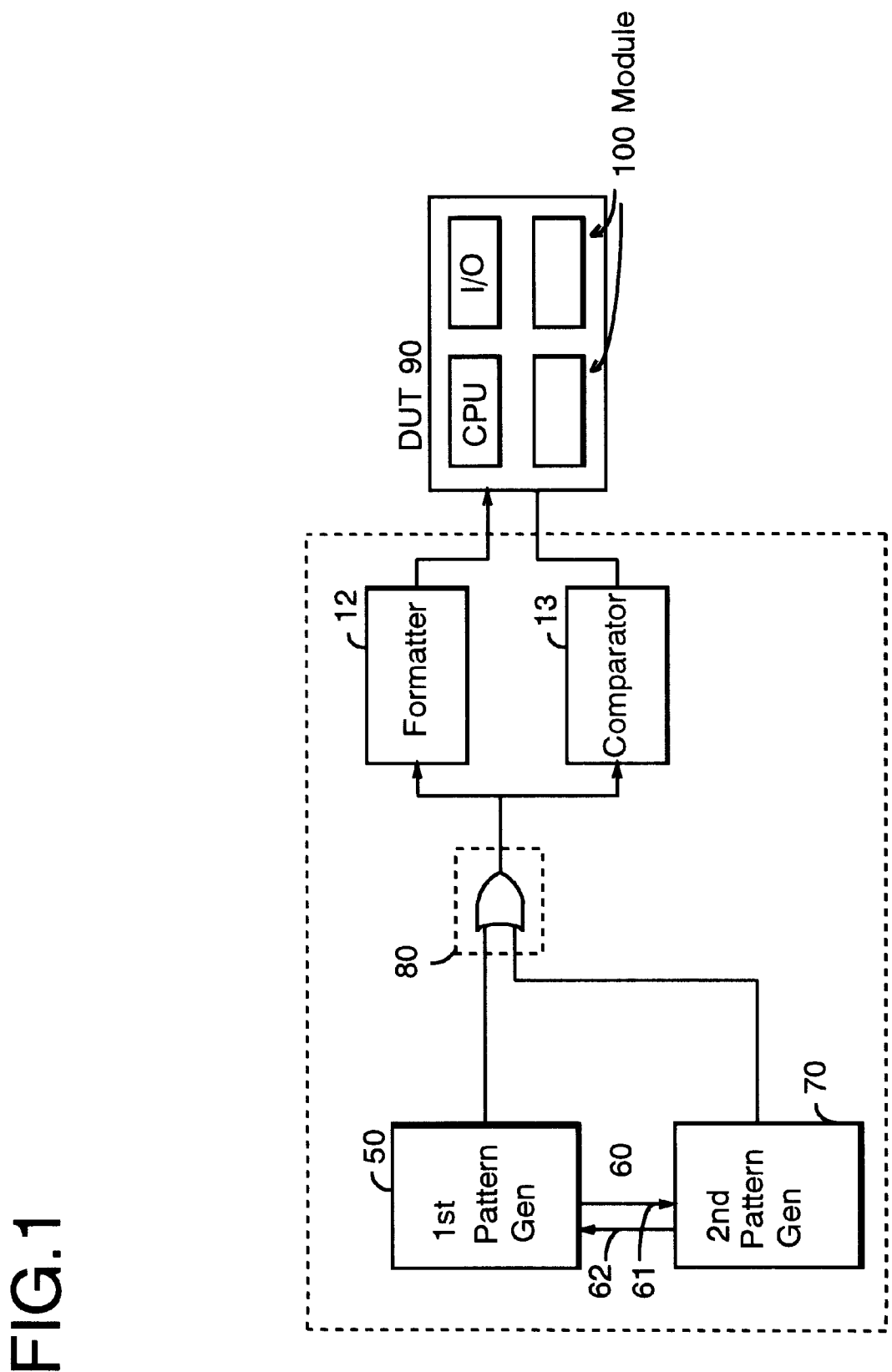
FIG. 1 is a block diagram showing a structure of the pattern generator of the present invention having two systems for the semiconductor test system for generating test patterns.

A semiconductor test system having a test pattern generator according to the first embodiment of the present invention is shown in FIG. 1. In the present invention, the pattern generator includes two or more pattern generation blocks for separately storing test patterns for function modules common among the semiconductor devices and test patterns for function modules different from device to device.

Figure 5:
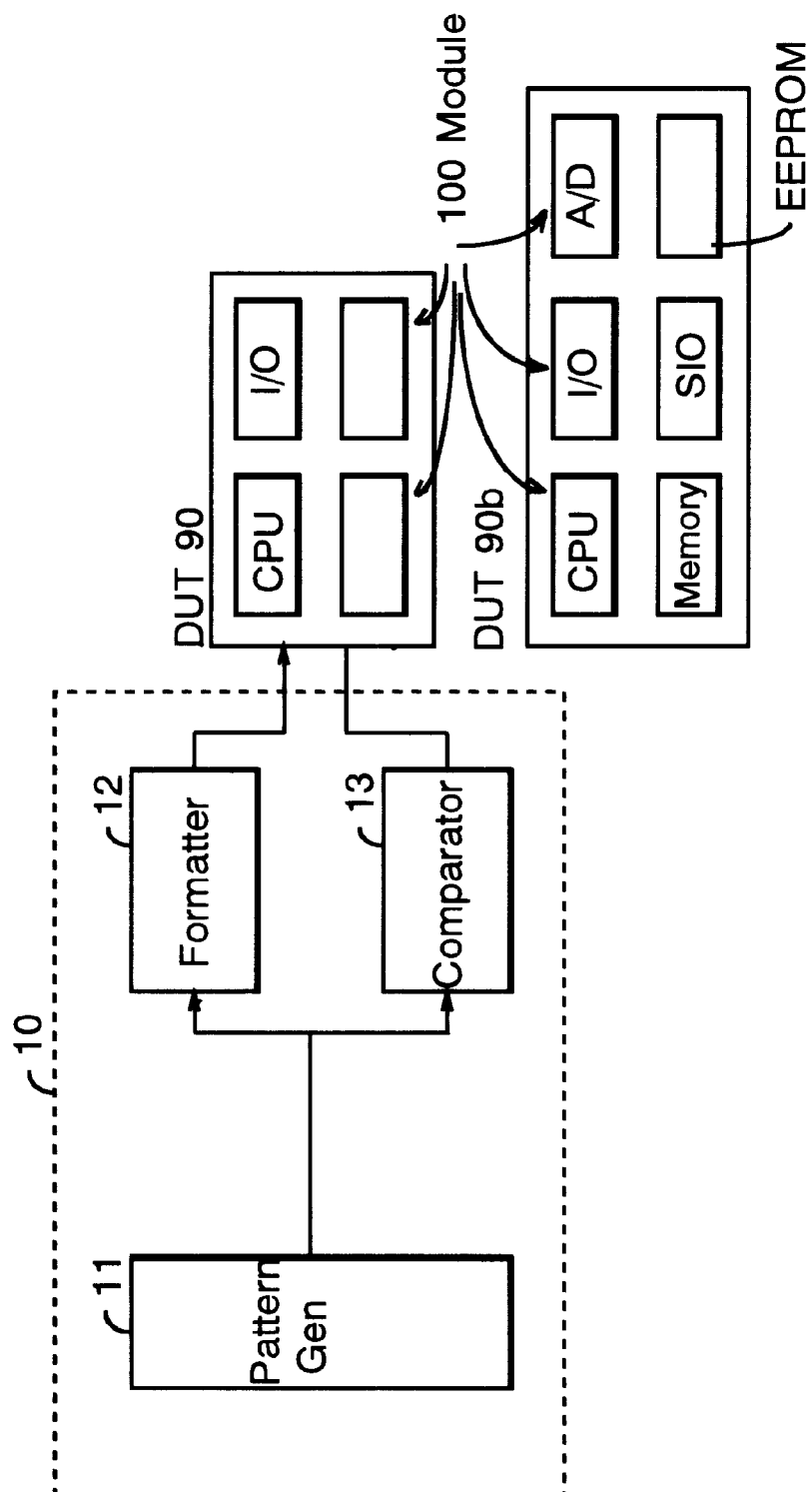
FIG. 5 is a block diagram showing a basic structure of a conventional semiconductor test system.

In the example of FIG. 1, the semiconductor test system has a first pattern generation block 50, a second pattern generation block 70, a communication means 60, a combine circuit 80, a wave formatter 12, and a logic comparator 13. A semiconductor device 90 to be tested includes modules such as a memory and a timer in addition to a CPU and an interface I/O. In this arrangement, the wave formatter 12, the logic comparator 13 and the semiconductor device under test (DUT) 90 are the same as the conventional example of FIG. 5. The arrangement of the pattern generation blocks 50 and 70 and the combine circuit 80 performs a unique function of the present invention.

Figure 7:
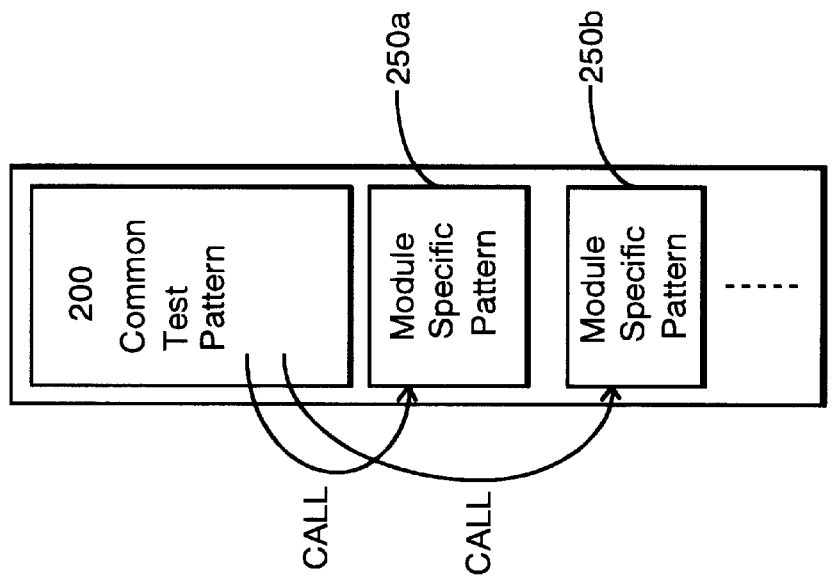
FIG. 7 is a schematic diagram showing test patterns loaded in a memory of a conventional test pattern generator for testing a semiconductor device having a function module common to other devices and function modules specific to the device under test.
Figures 8A, 8B:
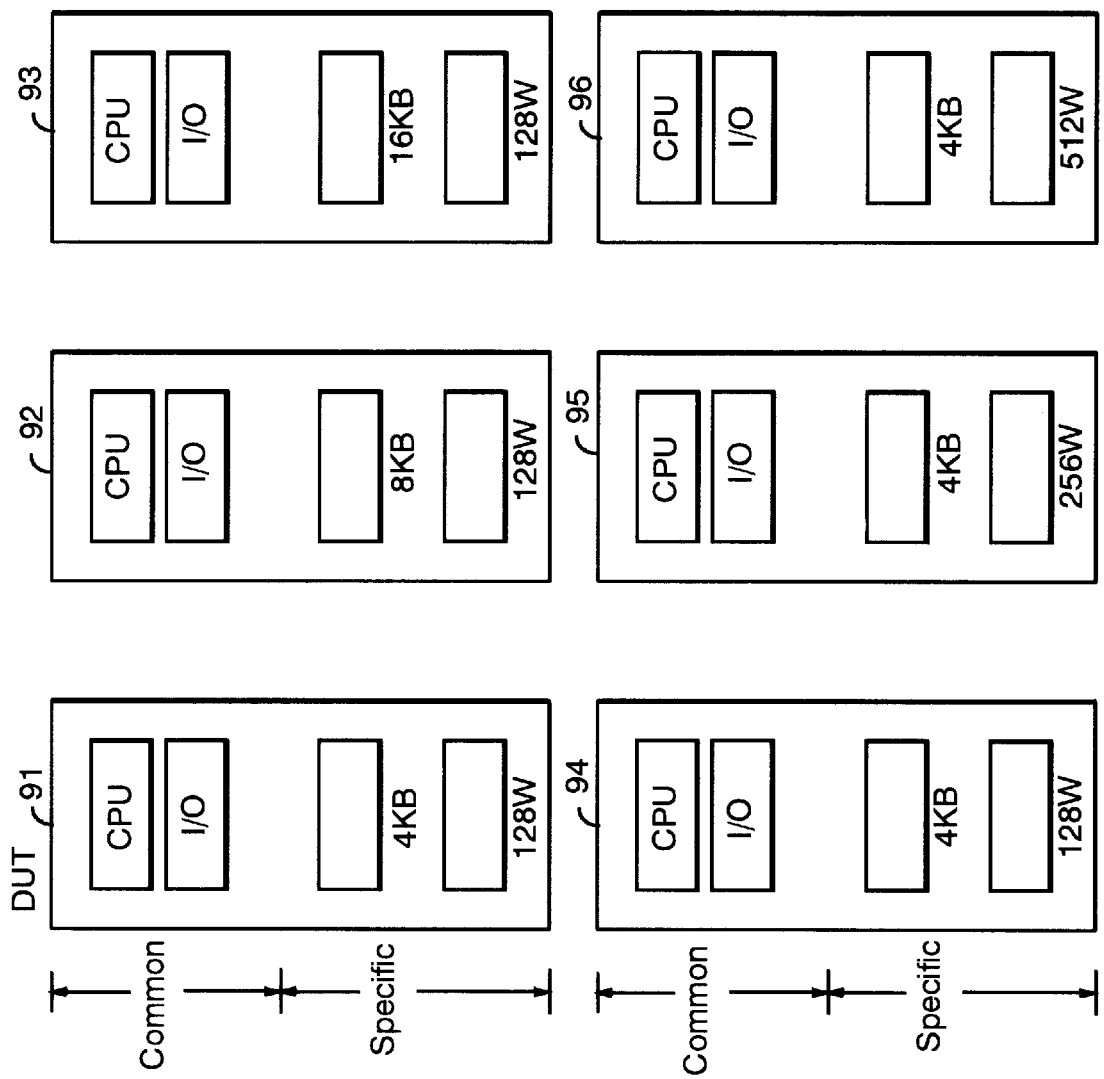
FIGS. 8A and 8B is a schematic diagram showing examples of combination of function modules in semiconductor devices such as ASICs (Application Specific Integrated Circuit).

As shown in FIG. 2A, in a memory of the first pattern generation block 50, it is stored a test pattern 200 of FIG. 7 which is common to semiconductor devices to be tested. As shown by reference numeral 250 of FIG. 2B, a memory of the second pattern generation block 70 stores test patterns 250*a*, 250*b* . . . of FIG. 7 which are unique to modules in the semiconductor devices to be tested. FIG. 2C shows an example of test patterns in the second pattern generation block 70 in which test patterns 251, 252, 253 and 254 are stored for testing, for example, memory modules 4K, 8K, 16K and 32K byte, respectively.

The first pattern generation block 50 and the second pattern generation block 70 interact with each other through the communication means 60. For example, the communication means 60 includes a start signal 61 and an end signal 62 as shown in FIG. 1. The combine circuit 80 combines the test patterns from the first and second test pattern generation blocks 50 and 70. Therefore, an example of the combine circuit is an OR circuit. The output of the combine circuit 80 is connected to the wave formatter 12 to provide the test pattern and the logic comparator 13 to provide the expected data signals.

In operation, the common test pattern 200 is generated by the first pattern generation block 50. The first pattern generation block 50 sends a start signal 61 to the second pattern generation block 70 for generating the module specific test patterns 250. To produce such a start signal, for example, an instruction is stored in the memory of the first pattern generation block 50. The instruction is executed to generate the start signal for the second pattern generation block at an appropriate timing such as the end of the generation of the common test pattern 200. After sending the start signal 61 to the second pattern generation circuit 70, the first pattern generation circuit 50 temporarily suspends its operation.

In receiving the start signal, the second pattern generation block 70 starts generating the module specific test patterns 250. At the end of the pattern generation, the second pattern generation block 70 sends the end signal 62 to the first pattern generation block 50 and suspends its operation. When receiving the end signal 62 from the second pattern generation block, the first pattern generation block 50 releases its suspension and proceeds to the next operation. By repeating the operation in the foregoing through the communication means 60, test patterns for semiconductor devices under test having various function modules can be generated.

It should be noted that, in this arrangement, the first pattern generation block 50 will not participate in the generation of the test patterns 250 specific to the function modules in the semiconductor device under test. In other words, the first and second pattern generation blocks are independent from one another. Thus, the second pattern generation block 70 can generate the module specific test patterns 250 separately from the common test pattern 200 in the first pattern generation block 50.

Therefore, in the example of FIG. 2, the module specific test patterns 251–254 are sequentially generated by the second pattern generation block 70 to test the memory modules 4K, 8K, 16K and 32K byte in the semiconductor device under test. The common test pattern 200 in the first pattern generation block 50 only needs to know the existence of the specific modules in the semiconductor device under test. Namely, the module specific test patterns 250 can be unknown to the device common test pattern 200. Therefore, the test patterns in the first and second pattern generation blocks can be independent from one another by only exchanging start and end signals between the pattern generation blocks.

As a consequence, the number of overall test patterns for testing the semiconductor devices is dramatically decreased in the present invention. This is because each of the module specific test patterns is freely combined with the device common test pattern to form an overall test pattern depending on the combination of the function modules in the semiconductor device to be tested rather than preparing one fixed overall test pattern for each semiconductor device to be tested.

Figure 9:
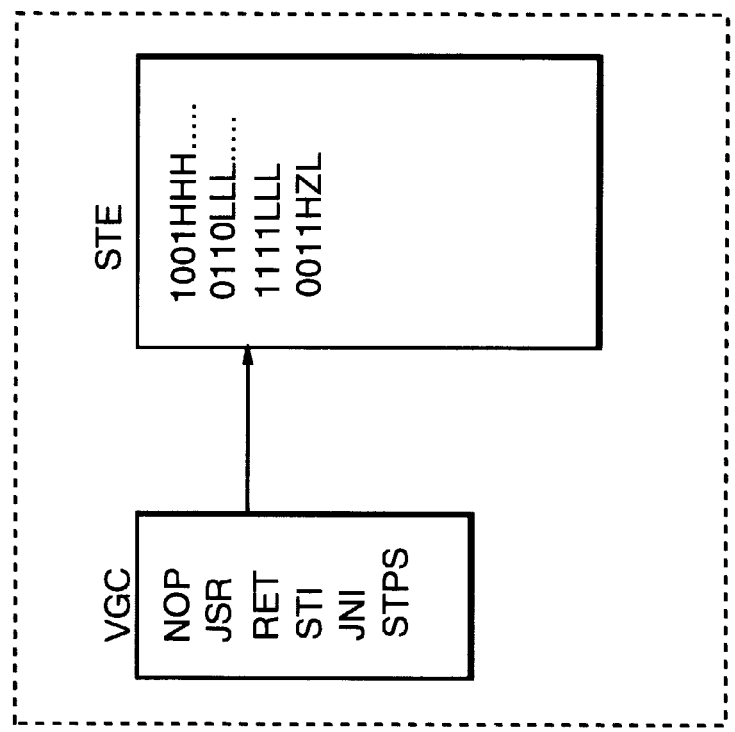
FIG. 9 is a schematic diagram showing a basic structure of a memory in the test pattern generator.

FIG. 9 shows an example of memory structure in the first and second pattern generation blocks 50 and 70. The memory is formed of a vector generation control (VGC) memory and a stimulus and expected (STE) memory. The VGC memory stores sequence control instructions for defining overall test conditions and supplying external control signals or micro instructions for controlling pattern generation sequence such as repetition, jump, and subroutine of the pattern generation. The STE memory stores the test pattern to be generated based on the instruction from the VGC memory. The test pattern includes patterns to be applied to the device under test and expected value patterns to compare the resultant output signals from the device under test. For example, the VGC memory stores the instructions, such as "NOP" (no operation), "JRS" (jump to subroutine), "RET" (return) and the like as shown in FIG. 9 while the STE memory stores pattern data of "1" and "0" combination.

In the foregoing operation of the present invention, for generating the start signal 61 from the first pattern generation block 50 to activate the module specific patterns from the second pattern generation block 70, an additional instruction is stored in the VGC memory of FIG. 9. For example, an instruction designated by a mnemonic code "WAPG" is stored in the VGC memory of the first pattern generation block 50. When the mnemonic "WAPG" is read from the VGC memory, the first pattern generation block 50 provides the start signal 61 to the second pattern generation block 70 and suspends its operation until it receives the end signal 62 from the second pattern generation block 70.

In the second pattern generation block 70, it is provided with means for starting the generation of the module specific test patterns 250 when receiving the start signal 61 from the first pattern generation block 50 which will be described with reference to FIGS. 3 and 4. Further, in the VGC memory of the second pattern generation block 70 which stores the sequence control instructions as shown in FIG. 9, an additional instruction such a mnemonic "LOOPEXIT" is installed to go back to the first pattern generation block 50 when the assigned task is completed.

For example, at the end of each of the module specific test patterns TEST1–TESTn, the "LOOPEXIT" instruction is provided as shown in FIG. 3A. The "LOOPEXIT" instruction is executed at the end of the generation of the module specific test pattern which transmits the end signal 62 to the first pattern generation block 50. After sending the end signal 62, the second pattern generation block 70 suspends its operation.

The more detailed operation regarding the second pattern generation block 70 in FIG. 3 is described below. In FIG. 3A, the second pattern generation block 70 includes a start register 71, a program counter 75 and a pattern memory PM. As mentioned in the foregoing, the pattern memory PM is formed of the VGC memory and STE memory. In the example of FIG. 3, based on the instruction from the first pattern generation block 50, the second pattern generation block 70 generates one set of test patterns for the corresponding function module in the device under test. At the end of each set of the test patterns, the operation goes back to the first pattern generation block 50 by the instruction "LOOPEXIT" provided at the end of the test pattern. This process repeats for generating all the test patterns for all of the function modules in the device under test as shown in FIG. 3B.

In the configuration of FIG. 3A, the start register 71 stores a start address for the first set of test pattern TEST1. The start address is provided to the program counter 75 which increments the addresses of the memory storing the test pattern TEST1 in synchronism with a clock signal (not shown). Accordingly, the test pattern for the corresponding module is generated by the pattern generator. At the end of the test pattern TEST1, the instruction "LOOPEXIT" is executed and, as a result, the end signal 62 is provided to the first pattern generation block 50. The second pattern generation block 70 suspends its operation while the first pattern generation block 50 is in operation.

At the end of the assigned part of job, the first pattern generation block 50 execute the instruction "WAPG" which sends the start signal 61 to the second pattern generation block 70 to initiate the test pattern TEST2. For determining the start address for the test pattern "TEST2", such a start address is simply the next address of the last address of the first test pattern TEST1, which obviates the need to rewrite the address for the program counter. Alternatively, the first test pattern TEST1 may store the instruction for assigning the start address to be supplied to the start register 71 which is set to the program counter 75 for generating the second test pattern TEST2.

At the end of the test pattern TEST2 for the specific function module, the operation goes back to the first pattern generation block 50. When the instruction "WAPG" is executed again in the first pattern generation block, the start signal 61 is transmitted to the second pattern generation block 70 for generating the third test pattern TEST3 as shown in FIG. 3B. Then the second pattern generation block 70 generates the end signal 62 by executing the "LOOPEXIT" instruction so that the operation in the first pattern generation block 50 is started again.

Figure 4B:
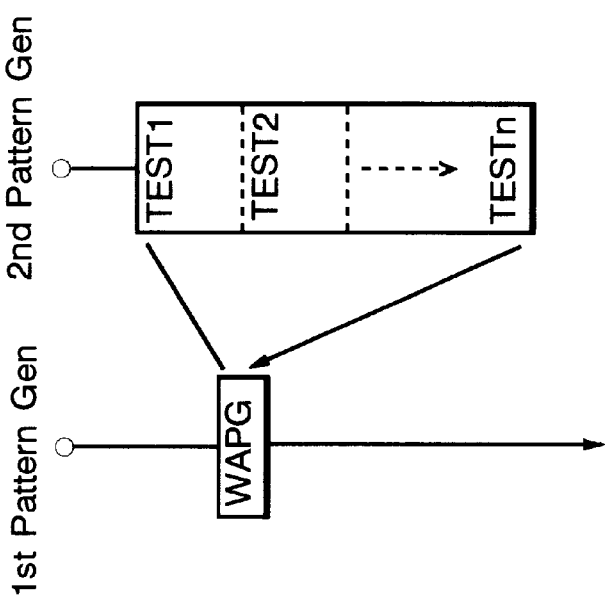
FIG. 4 is a schematic diagram showing another example of the second pattern generator of FIG. 1 of the present invention wherein an internal control structure thereof is shown in FIG. 4A and pattern generation sequence is shown in FIG. 4B.

FIG. 4 shows another example of procedure for generating the device common test pattern and the module specific test pattern according to the present invention. In this example, the module specific test patterns for two or more function modules are consecutively generated by the second pattern generation block 70 when receiving the start signal 61 from the first pattern generation block 50. After generating all of the module specific test patterns, the second pattern generation block 70 executes the "LOOPEXIT" instruction to send the end signal 62 to the first pattern generation block 50.

Figure 4A:
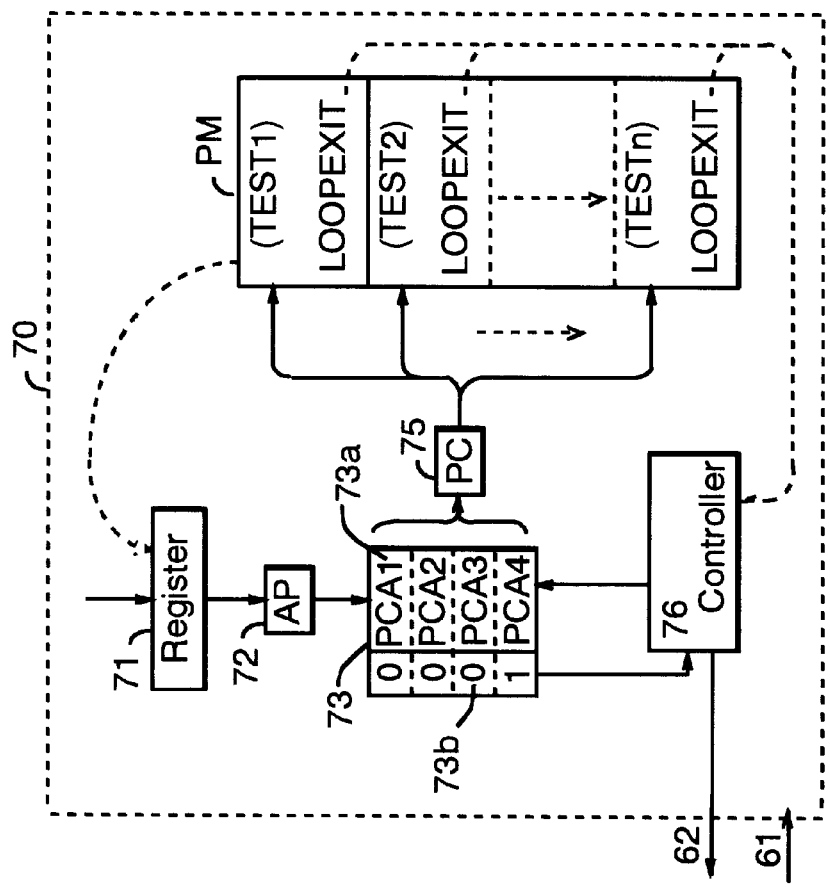

In addition to the pattern memory PM, the second pattern generation block 70 of FIG. 4 includes a start register 71, an address pointer 72, a loop control memory 73, a program counter 75 and a loop controller 76 as shown in FIG. 4A. The loop control memory 73 stores address data 73$a$ to be supplied to the program counter 75 and loop end signals 73$b$ to be supplied to the loop controller 76. The start register 71 stores the first address of the loop control memory 73 wherein start address data PCA1 of the first set of test pattern TEST1 is stored as shown in FIG. 4A.

In receiving the start signal 61 from the first pattern generation block 50, the first address for the loop control memory 73 is provided from the start register 71 to the address pointer 72. Under the control of the loop controller 76, the loop control memory 73 reads the address data PCA1 and the loop end signal stored in the address indicated by the address pointer 72. This address data PCA1 is a start address of the module specific test pattern TEST1 in the pattern memory PM and which is set in the program counter 75. After reading the loop memory 73, the address pointer 72 is incremented by one. The loop end signal which shows "0" is provided to the loop controller 76.

By the timing of the clock signal (not shown), the program counter 75 increments the address for the pattern memory PM for generating the test pattern TEST1. At the end of the test pattern TEST1, the "LOOPEXIT" instruction is detected and transferred to the loop controller 76. When the loop end signal from the loop memory 73 is "0", the loop controller 76 controls the loop memory 73 to read the next address indicated by the address pointer 72. Thus, the second address data PCA2 is provided to the address counter 75 as a start address of the nest module specific test pattern TEST2.

In this manner, the module specific test patterns TEST1–TESTn are generated by the second pattern genera-tion block 70. When the loop end signal shows "1", the loop controller 76 sends the end signal 62 when it receives the "LOOPEXIT" instruction from the memory PM. The end signal 62 is provided to the first pattern generation block 50. At the same time, the operation of the second pattern generation block 70 is suspended until receiving the start signal 61.

Figure 10B:
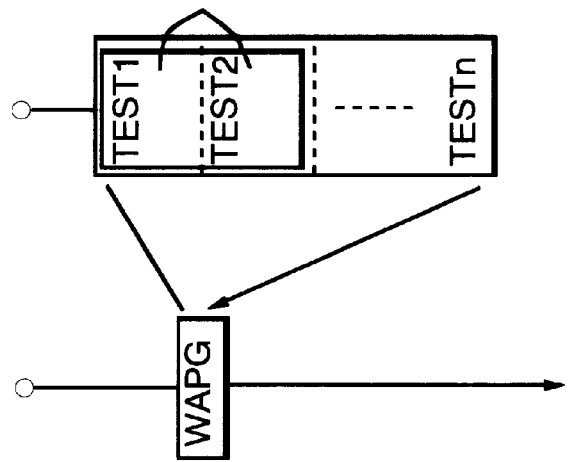
FIG. 10 is a schematic diagram showing a further example of internal control structure of the second pattern generation block of the present invention.
Figure 10A:
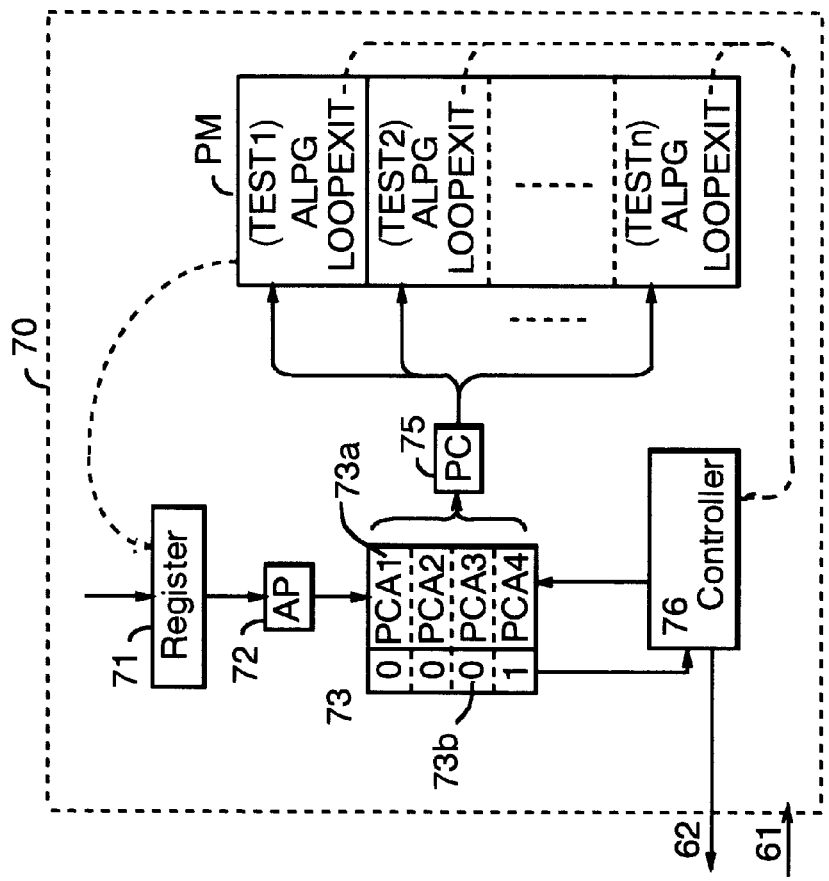

FIG. 10 shows a further example of the second pattern generation block. Although the block diagrams of FIG. 10A and 10B are substantially the same as that of FIG. 4, the memory structure of the pattern memory PM is different. Namely, in the above examples of FIGS. 1–4, the pattern memory PM is structured as shown in FIG. 9 wherein the pattern data is stored in the STE memory and is read out based on the instruction in the VGC memory. In the example of FIG. 10, the pattern generation block is structured to generate an algorithmic test pattern. Typically, an algorithmic pattern is a test pattern having a mathematical sequence for testing a semiconductor memory device.

Figure 11:
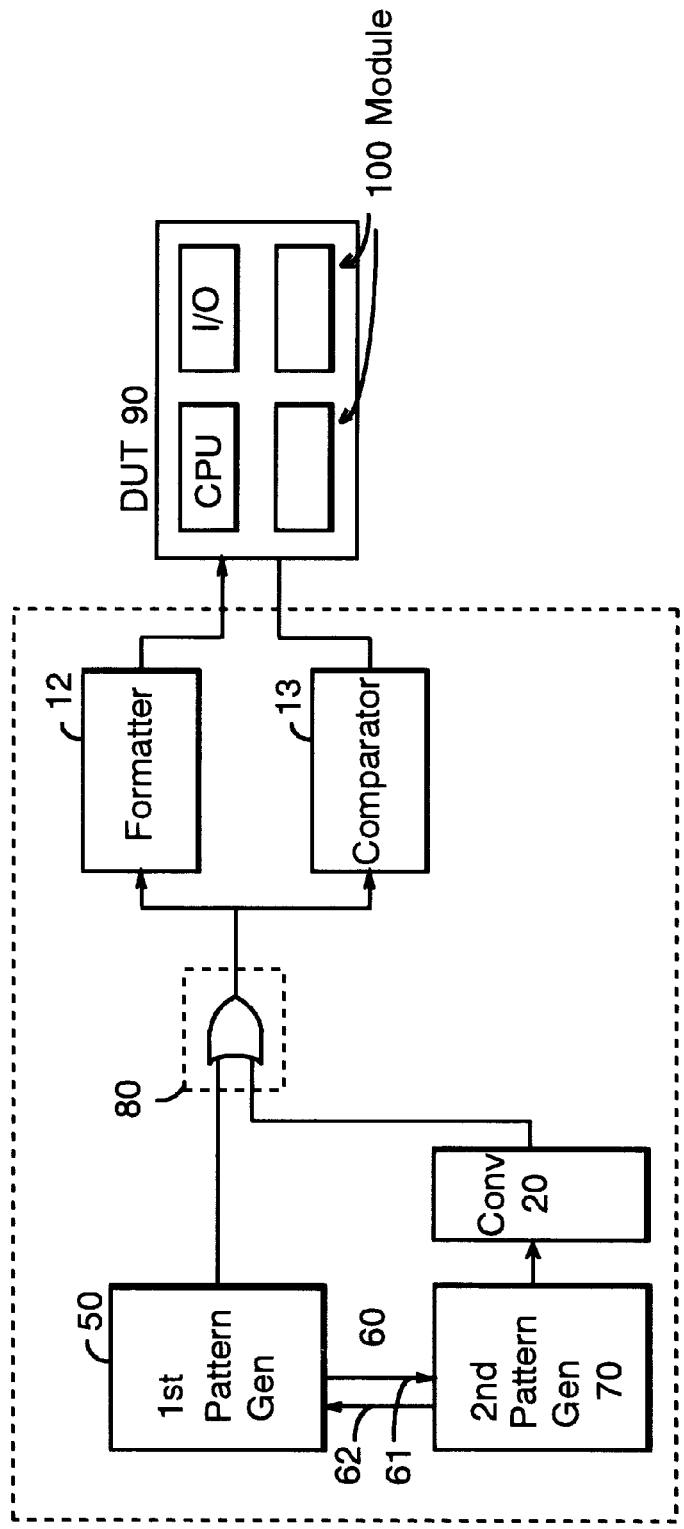
FIG. 11 is a block diagram showing another structure of semiconductor test system of the present invention having a pattern conversion circuit for testing a semiconductor device having a functional module which is interfaced with an intermediate circuit.

FIG. 11 is a block diagram showing another structure of semiconductor test system of the present invention having a pattern conversion means 20 for testing a semiconductor device having a functional module which is interfaced with an intermediate circuit. The semiconductor test system of FIG. 11 includes a first pattern generation block 50, a second pattern generation block 70, a communication means 60, a combine circuit 80, a wave formatter 12, a logic comparator 13. A semiconductor device 90 to be tested includes function modules unique to the device 90.

Further, an intermediate circuit is included in the semiconductor device 90 which interfaces with the function module. An example of such an intermediate circuit in the device to be tested is a circuit 30 shown in FIG. 6 which is, for example, a parallel-serial converter. The module specific test pattern generated by the second pattern generation block 70 is provided to the pattern conversion means 20. The test pattern is converted to an appropriate form by the pattern conversion means 20 so that the test pattern is supplied to the target function module through the intermediate circuit.

Figure 6:
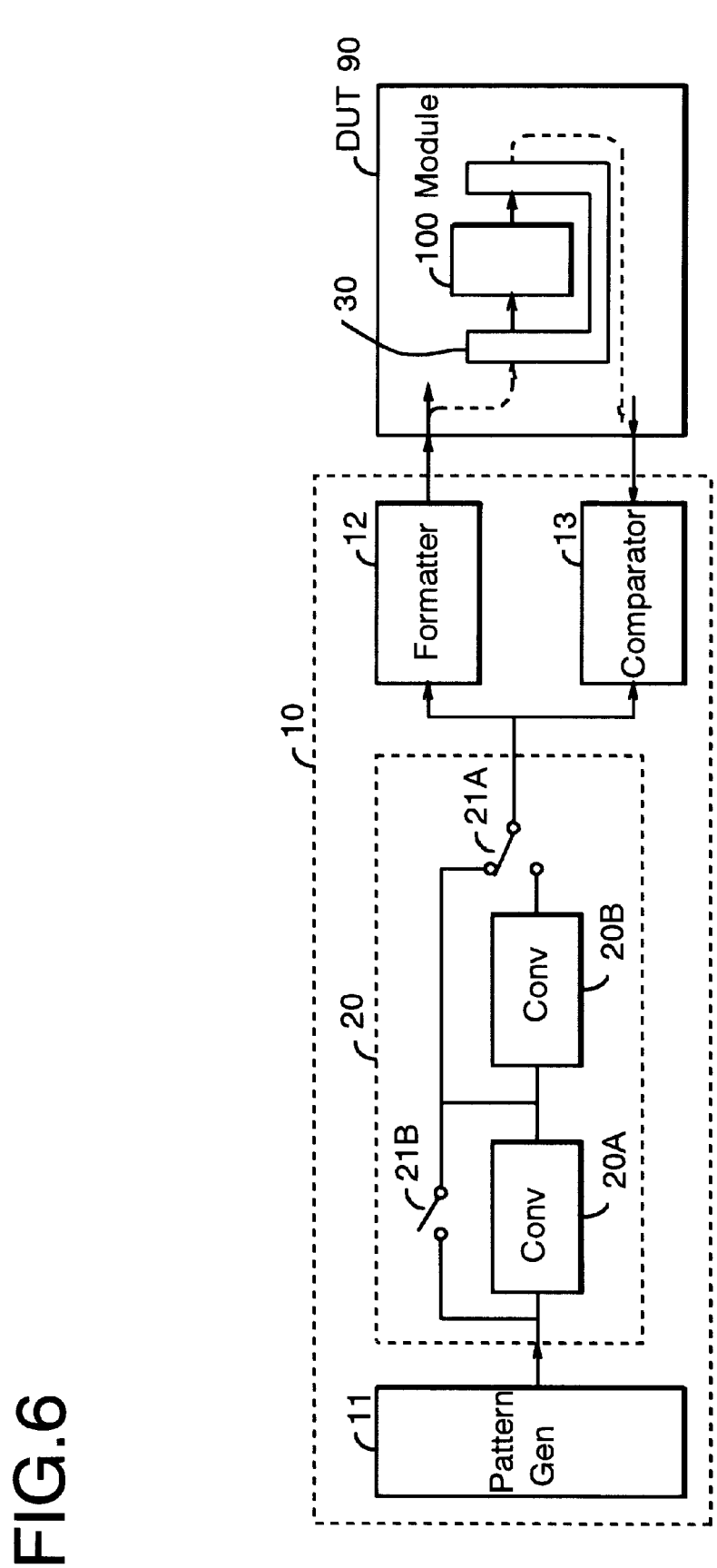
FIG. 6 is a block diagram showing a basic structure of a conventional semiconductor test system having a pattern conversion means for testing a semiconductor device having a functional module which is interfaced with an intermediate circuit.

Similar to the example of FIG. 1, in the memory of the first pattern generation block 50, it is stored a test pattern 200 which is common to semiconductor devices to be tested. In the memory of the second pattern generation block 70, it is stored test patterns 250$a$, 250$b$ . . . which are unique to function modules provided in the semiconductor device 90 to be tested. Each of the function modules may be interfaced with the inputs of the semiconductor device through the intermediate circuit such as shown in FIG. 6.

The first pattern generation block 50 and the second pattern generation block 70 interact with each other through the communication means 60. For example, the communication means 60 includes a start signal 61 and an end signal 62 as shown in FIG. 11. The combine circuit 80 combines the test patterns from the first and second test pattern generation blocks 50 and 70. The output of the combine circuit 80 is connected to the wave formatter 12 to format the waveform of the test pattern to be supplied to the semiconductor device 90 and the logic comparator 13 to provide the expected data signals to compare the output of the device 90.

In operation, the common test pattern 200 is generated by the first pattern generation block 50. The first pattern generation block 50 sends a start signal 61 to the second pattern generation block 70 for generating the module specific test patterns 250. To produce such a start signal, for example, an instruction is stored in the memory of the first pattern generation block 50. The instruction is executed to generate the start signal for the second pattern generation block at an appropriate timing such as the end of the generation of the common test pattern 200. After sending the start signal 61 to the second pattern generation circuit 70, the first pattern generation circuit 50 temporarily suspends its operation.

In receiving the start signal, the second pattern generation block 70 starts generating the module specific test patterns 250. At the end of the pattern generation, the second pattern generation block 70 sends the end signal 62 to the first pattern generation block 50 and suspends its operation. When receiving the end signal 62 from the second pattern generation block, the first pattern generation block 50 releases its suspension and proceeds to the next operation. By repeating the operation in the foregoing through the communication means 60, test patterns for semiconductor devices under test having various function modules can be generated. As stated above, the test pattern from the second pattern generation block 70 is converted by the pattern conversion means 20 to test the module through the intermediate circuit.

The pattern conversion means 20 inversely converts the test pattern depending on the type of the intermediate circuit 30 in the DUT 90. In this arrangement, even when a different intermediate circuit is employed in the device under test, the same test pattern as produced for the certain module can be commonly used for testing the semiconductor device having the same type of module.

Figure 12:
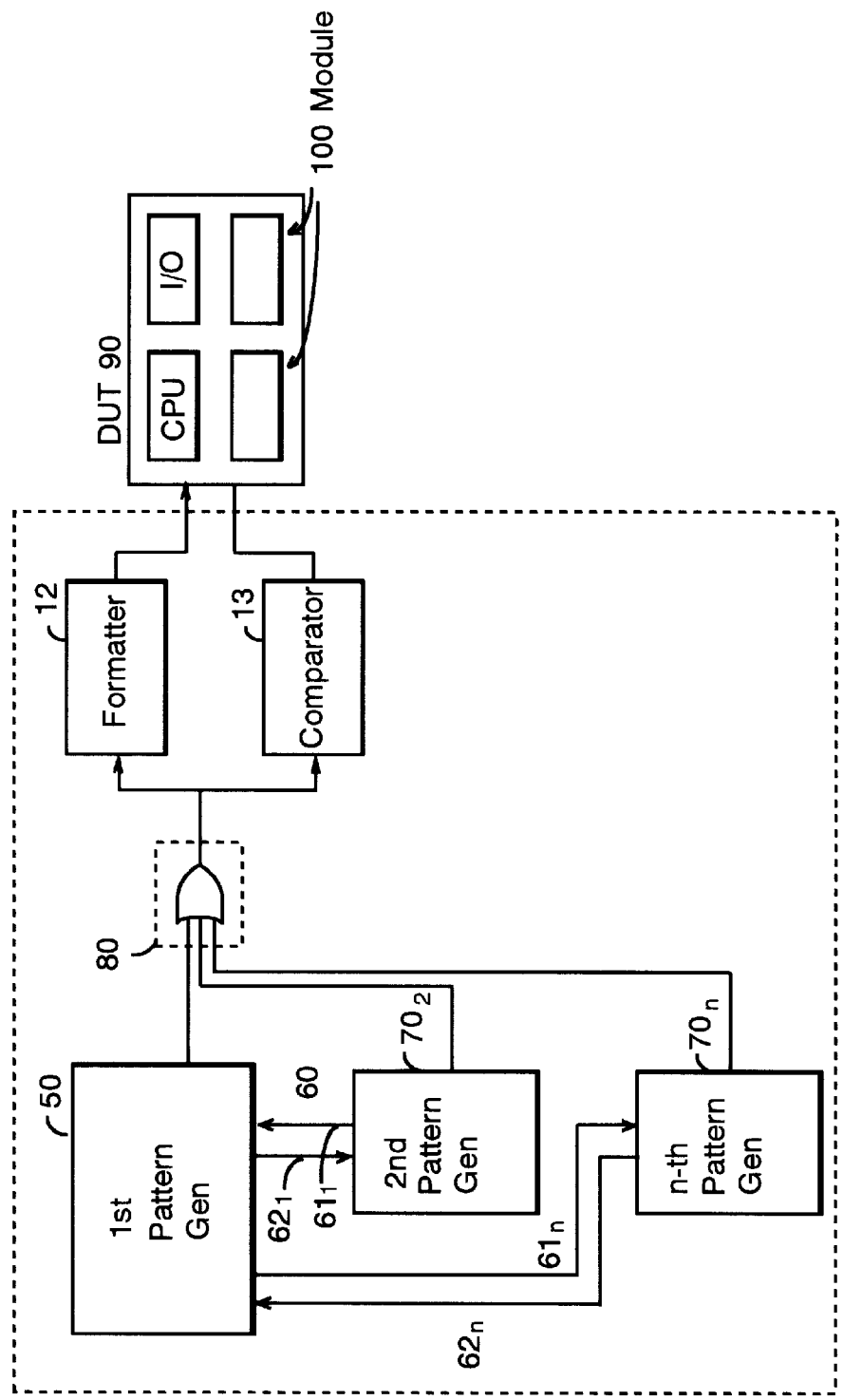
FIG. 12 is a block diagram showing a structure of the pattern generator of the present invention having n pattern generation systems for generating test patterns for the semiconductor test system.
Figure 13:
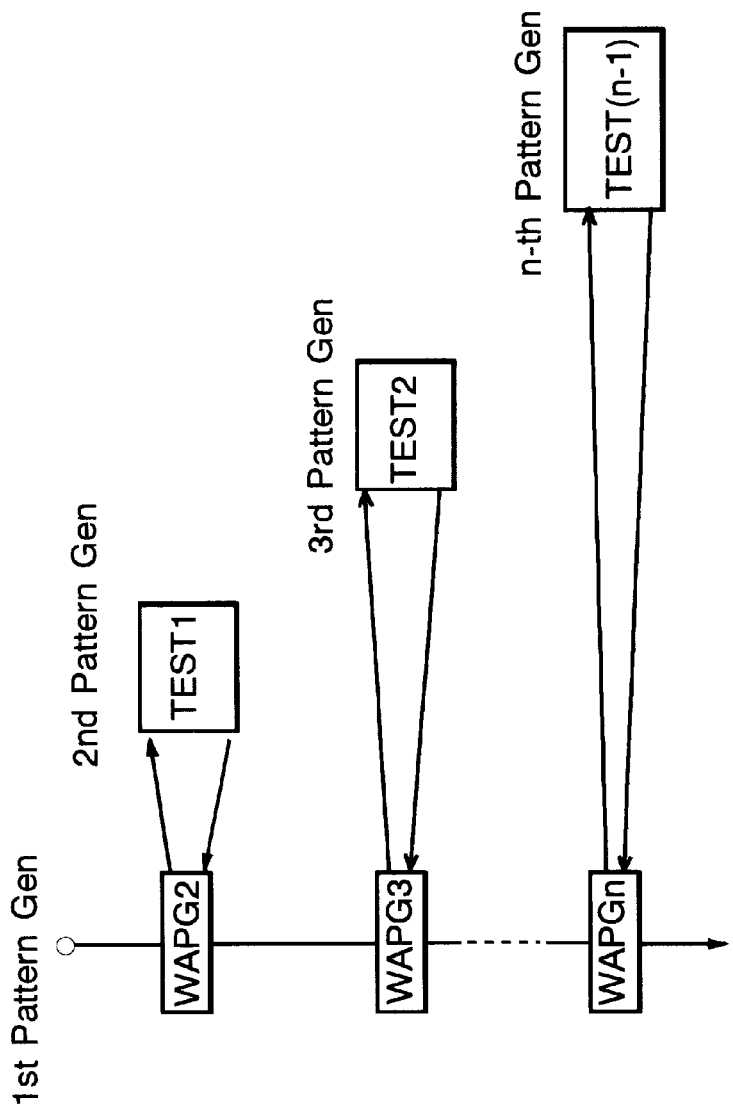
FIG. 13 is a schematic diagram showing pattern generation sequence in the first to n-th pattern generation blocks in FIG. 12 of the present invention.

FIGS. 12 and 13 show a further example of the test pattern generator of the present invention. FIG. 12 is a block diagram showing a structure of the pattern generator of the present invention having n pattern generation systems for generating test patterns and FIG. 13 is a schematic diagram showing pattern generation sequence in the first to n-th pattern generation blocks shown in FIG. 12 of the present invention. The semiconductor test system of FIG. 12 includes a first pattern generation block 50, second, third, . . . n-th pattern generation blocks $70_2$–$70_n$, a communication means 60, a combine circuit 80, a wave formatter 12, and a logic comparator 13. A semiconductor device 90 to be tested includes function modules unique to the device 90.

In the memory of the first pattern generation block 50, it is stored a test pattern 200 which is common to semiconductor devices to be tested. In the memory of the second to n-th pattern generation blocks $70_2$–$70_n$, test patterns 250a, 250b . . . 250n which are dependent upon the specific characters of modules provided in the semiconductor device 90 to be tested are stored.

The combine circuit 80 combines the test patterns from the first, second and n-th test pattern generation blocks 50, $70_2$–$70_n$. The output of the combine circuit 80 is connected to the wave formatter 12 to format the waveform of the test patterns to be supplied to the semiconductor device 90. The output of the combine circuit 80 is also connected to the logic comparator 13 to provide the expected data signals to compare the output signal of the device 90.

The first pattern generation block 50 and each of the second to n-th pattern generation blocks $70_2$–$70_n$ interact with each other through the communication means 60. For example, the communication means 60 includes a start signal $61_2$ and an end signal $62_2$ between the first pattern generation block 50 and the second pattern generation block 70. The communication means 60 further includes other start and end signals for other pattern generation blocks, for example, a start signal $61_n$ and an end signal $62_n$ between the first pattern generation block 50 and the n-th pattern generation block $70_n$ as shown in FIG. 12. Each of the second to n-th pattern generation blocks has a structure, for example, shown in FIG. 3A or FIG. 4A.

In operation, the test pattern 200 which is common to the other semiconductor devices to be tested is generated by the first pattern generation block 50. The first pattern generation block 50 sends the start signal 61 to the second pattern generation block 70 for generating the module specific test pattern 250a. To produce such a start signal, for example, an instruction such as "WAPG" is stored in the memory of the first pattern generation block 50.

As shown in FIG. 13, by executing the instruction "WAPG2", the start signal $61_2$ is transmitted to the second pattern generation block at an appropriate timing such as the end of the generation of the assigned portion of the common test pattern 200. After sending the start signal $61_2$ to the second pattern generation circuit 70, the first pattern generation circuit 50 temporarily suspends its operation.

In receiving the start signal $61_2$, the second pattern generation block 70 starts generating the module specific test patterns 250a to perform the TEST1. At the end of the TEST1, the second pattern generation block 70 sends the end signal $62_2$ to the first pattern generation block 50 and suspends its operation. When receiving the end signal $62_2$ from the second pattern generation block, the first pattern generation block 50 releases its suspension and proceeds to the next operation.

Similarly, the first pattern generation block 50 generates the start signal $61_3$ to initiate the third pattern generation block $70_3$ by executing the "WAPG3" instruction. As shown in FIG. 13, the third pattern generation block $70_3$ performs the "TEST2" and sends the end signal $62_3$ to the first pattern generation block 50. By repeating the operation as noted above until the n-th pattern generation block generates the end signal $62_n$ through the communication means 60, the test patterns for semiconductor devices under test having various function modules can be generated.

Figure 14:
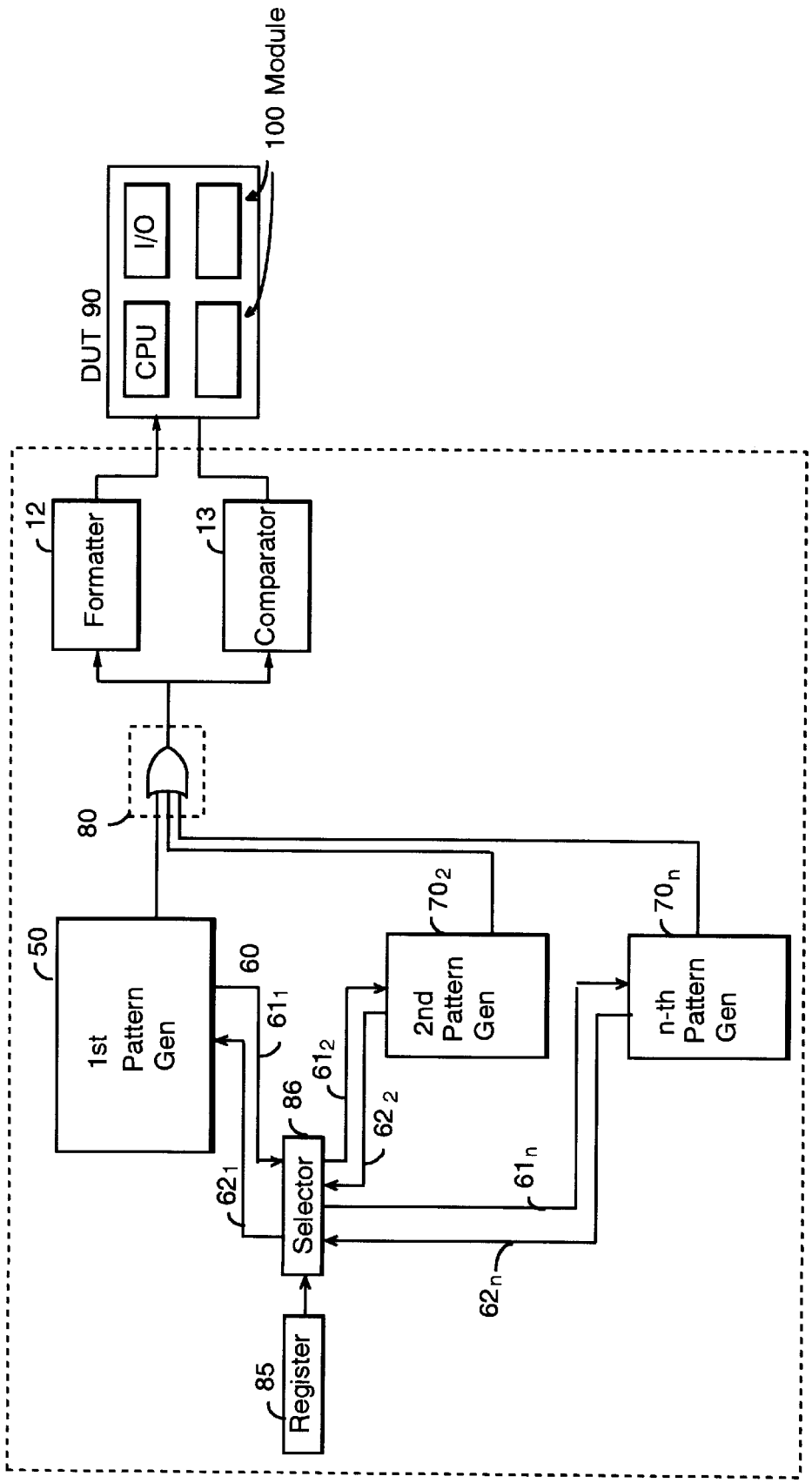
FIG. 14 is a block diagram showing another example of structure of the pattern generator of the present invention having n pattern generation systems for generating test patterns for the semiconductor test system.
Figure 15:
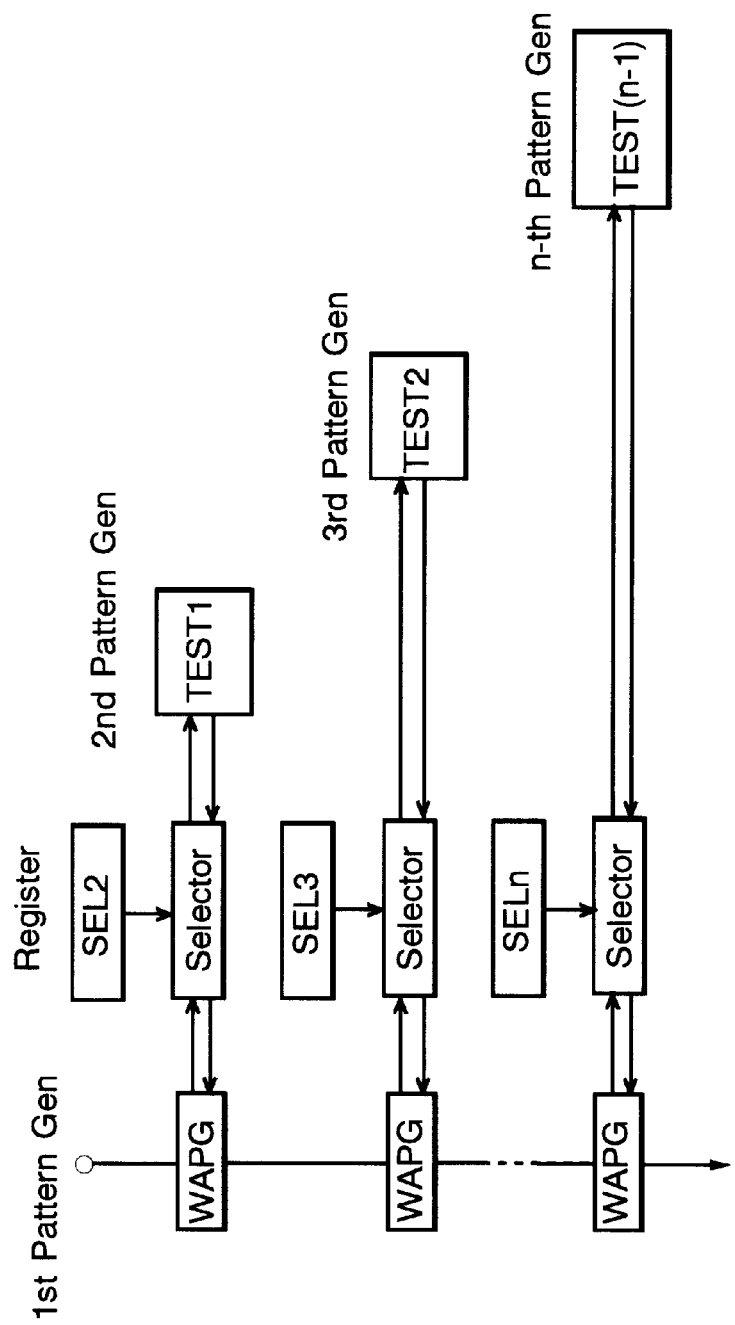
FIG. 15 is a schematic diagram showing pattern generation sequence in the first to n-th pattern generation blocks in FIG. 14 of the present invention.

FIGS. 14 and 15 show a further example of the test pattern generator of the present invention. FIG. 14 is a block diagram showing a structure of the pattern generator of the present invention having n pattern generation systems for generating test patterns and FIG. 15 is a schematic diagram showing pattern generation sequence in the first to n-th pattern generation blocks shown in FIG. 12 of the present invention. The semiconductor test system of FIG. 14 is different from that of FIG. 12 in the structure of the communication means between the first pattern generation block and the second to n-th pattern generation blocks.

The semiconductor test system of FIG. 14 includes a first pattern generation block 50, second, third, . . . n-th pattern generation blocks $70_2$–$70_n$, a communication means 60, a register 85, a selector 86, a combine circuit 80, a wave formatter 12, and a logic comparator 13. A semiconductor device 90 to be tested includes function modules unique to the device 90.

In the memory of the first pattern generation block 50, it is stored a test pattern 200 which is common to semiconductor devices to be tested. In the memory of the second to n-th pattern generation blocks $70_2$–$70_n$, test patterns 250a, 250b . . . 250n which are dependent upon the specific characters of modules provided in the semiconductor device 90 to be tested.

The combine circuit 80 combines the test patterns from the first, second and n-th test pattern generation blocks 50 and $70_2$–$70_n$. The output of the combine circuit 80 is connected to the wave formatter 12 to format the waveform of the test patterns to be supplied to the semiconductor device 90. The output of the combine circuit 80 is also connected to the logic comparator 13 to provide the expected data signals to compare the output signal of the device 90.

The first pattern generation block 50 and each of the second to n-th pattern generation blocks $70_2$–$70_n$ interact with each other through the communication means 60. The selector 86 is inserted between the first pattern generation block 50 and the second to n-th pattern generation blocks $70_2$–$70_n$. The selector 86 defines the pattern generation block to be linked to the communication means. The output of the register 85 is applied to the selector 86. The register 85 stores the data to be provided to the selector to select one of the pattern generation blocks.

For example, the communication means 60 connects the first pattern generation block 50 and the selector by a start signal $61_1$ and an end signal $62_1$. The communication means 60 further connects the selector 86 and the second to n-th pattern generation blocks by start signals $61_2$–$61_n$ and end signals $62_2$–$62_n$. Thus, the first pattern generation block 50 and the second pattern generation block 70 communicate one another by the start signal $61_2$ and the end signal $62_2$ through the selector 86. Similarly, the first pattern generation block 50 and the n-th pattern generation block $70_n$ communicate one another by the start signal $61_n$ and the end signal $62_n$ through the selector 86. Each of the second to n-th pattern generation blocks has a structure, for example, shown in FIG. 3A or FIG. 4A.

In operation, the test pattern 200 which is common to the other semiconductor devices to be tested is generated by the first pattern generation block 50. The first pattern generation block 50 sends the start signal $61_1$ to the selector 86 whereby the start signal is directed to the selected pattern generation block 70 for proceeding the module specific test TEST1–TESTn. Each of the second to n-th pattern generation blocks sends the stop signal 62 to the selector 86 whereby the stop signal $62_1$ is transmitted to the first pattern generation block 50.

To produce such a start signal, an instruction such as "WAPG" is stored in the memory of the first pattern generation block 50. As shown in FIG. 15, by executing the instruction "WAPG", the start signal $61_1$ is transmitted to the second pattern generation block through the selector 86 at an appropriate timing such as the end of the generation of the common test pattern 200. The selector 86 selects the second pattern generation block 70 based on the select data "SEL2" from the register 85. After sending the start signal $61_1$ to the second pattern generation circuit 70, the first pattern generation circuit 50 temporarily suspends its operation.

In receiving the start signal $61_2$ from the selector 86, the second pattern generation block 70 starts generating the module specific test patterns $250a$ to perform the test TEST1. At the end of the TEST1, the second pattern generation block 70 sends the end signal $62_2$ to the first pattern generation block 50 through the selector 86 and suspends its operation. When receiving the end signal $62_1$ from the selector 86 which is based on the end signal $62_2$ from the second pattern generation block, the first pattern generation block 50 proceeds to the next operation.

The first pattern generation block 50 generates the start signal $61_1$ to initiate the third pattern generation block $70_3$ by executing the "WAPG" instruction. The selector 86 selects the third pattern generation block based on the select data "SEL3" from the register 85 and sends the start signal $61_3$ to the third pattern generation block $70_3$. As shown in FIG. 15, the third pattern generation block $70_3$ performs the TEST2 and sends the end signal $62_3$ to the first pattern generation block 50 through the selector 86. By repeating the operation as noted above until the n-th pattern generation block generates the end signal $62_n$ after the TESTn through the selector 86 and communication means 60, the test patterns for semiconductor devices under test having various function modules can be generated.

As has been in the foregoing, according to the present invention, the test patterns common to the semiconductor devices to be tested are stored in the first pattern generation block 50 while the test patterns specific to the function modules different from device to device are separately stored in the second, third . . . n-th pattern generation blocks $70$–$70_n$. Namely, the module specific test patterns can be loaded in the second to n-th pattern generation blocks based on the combination of function modules included in the device to be tested.

According to the present invention, the pattern generator for the semiconductor test system has a plurality of pattern generation blocks for separately storing the common test pattern and the module specific test pattern in advance of the testing. In this arrangement, the pattern generator is able to separately prepare module specific test patterns and combine the module specific test patterns based on the combination of the function modules in the semiconductor device to be tested.

Further, the pattern generator of the present invention can sequentially access the plurality of pattern generation blocks which separately store the common test pattern and the module specific test pattern. Thus, the pattern generator is capable of minimizing the number of overall test patterns having the common test pattern and the module specific test pattern by arranging the common test pattern in the first pattern generation block and the module specific test patterns in the second pattern generation block based on the combination of function modules in the semiconductor device to be tested.

Moreover, since the test patterns can be prepared by combining the common test pattern and specific test patterns only when necessary, it is not necessary to produce a large number of complete test patterns requires for each type of device to be tested. Therefore, the present invention can save a large amount of time, cost and labor for producing the test pattern or managing the test programs.

Various modes of carrying out the present invention are contemplated as being within the scope of the following claims, particularly pointing out and distinctly claiming the subject matter which is regarded as the invention.

What is claimed is:

1. A pattern generator to be used in a semiconductor test system for testing a semiconductor device having function modules common to other semiconductor devices and specific function modules unique to the semiconductor device under test, comprising:

a first pattern generation means for generating test patterns for testing said common function modules in said semiconductor device under test;

a second pattern generation means for generating test patters for testing said specific function modules in said semiconductor device under test; and a pattern combine circuit which is connected to the outputs of said first and second pattern generation means and transmits said test patterns from either one of said first or second pattern generation means;

wherein said first pattern generation means sends a start signal to said second pattern generation means to initiate the operation of generating the module specific test patterns, and said second pattern generation means sends an end signal to said first pattern generation means to initiate the operation of the first pattern generation means.

2. A pattern generator as defined in claim 1, wherein said first pattern generation means suspends its operation after sending said start signal to said second pattern generation means.

3. A pattern generator as defined in claim 1, wherein said first pattern generation means includes a sequence control memory which stores instructions for controlling the test pattern generation, and a test and expected pattern memory which stores pattern data and expected data for generating the test pattern to be supplied to the device under test and expected pattern to be supplied to a logic comparator to compare the output signal of the device under test with said expected pattern, said sequence control memory storing an instruction for generating said start signal to be supplied to said second pattern generation means when a predetermined task of said first pattern generation means is completed.

4. A pattern generator as defined in claim 1, wherein said second pattern generation means suspend its operation after sending said end signal to said first pattern generation means.

5. A pattern generator as defined in claim 1, wherein said second pattern generation means includes a sequence control memory which stores instructions for controlling the test pattern generation, and a test and expected pattern memory which stores pattern data and expected data for generating the test pattern to be supplied to the device under test and the expected pattern to be supplied to a logic comparator to compare the output signal of the device under test with said expected pattern, said sequence control memory storing an instruction for generating said end signal to be supplied to said first pattern generation means when a predetermined task of said second pattern generation means is completed.

6. A pattern generator as defined in claim 1, wherein said second pattern generation means includes:
   a pattern memory for generating said test patterns for testing said function modules specific to said semiconductor device under test;
   a start register for defining a start address of said pattern memory for generating said test patterns for said specific function modules; and
   a program counter for incrementing address data for said pattern memory starting from said start address from said start register;
   wherein said pattern memory storing an instruction for generating said end signal to be supplied to said first pattern generation means when a predetermined task of said second pattern generation means is completed.

7. A pattern generator as defined in claim 6, wherein said pattern memory has a plurality of memory blocks, each of said memory blocks storing a set of test patterns for testing a corresponding function module provided in said semiconductor device under test and generating said end signal at the end of said set of said test patterns.

8. A pattern generator as defined in claim 1, wherein said second pattern generation means includes:
   a pattern memory having a plurality of memory blocks for generating said test patterns for testing said function modules specific to said semiconductor device under test, each of said memory blocks in said pattern memory storing an instruction for generating a block end signal to be supplied to said first pattern generation means every time when a predetermined set of test patterns assigned to said memory block has been generated;
   a loop control memory for defining start addresses of said plurality of memory blocks in said pattern memory and a loop end signal indicating the end of generating said test patterns by the last memory block in said pattern memory;
   a start register for supplying a start address of said loop control memory for generating said start addresses of said memory blocks;
   a program counter for incrementing address data for each of said memory blocks in said pattern memory starting from said start addresses from said loop control memory; and
   a loop controller for sending said end signal to said first pattern generation means based on said loop end signal from said loop control memory and said block end signals from said memory blocks.

9. A pattern generator as defined in claim 1, further includes a pattern conversion means for converting said test patterns from said second pattern generation means when said function module in said semiconductor device under test includes an intermediate circuit between input terminals of said semiconductor device and said function module.

10. A pattern generator to be used in a semiconductor test system for testing a semiconductor device having function modules common to other semiconductor devices and specific function modules unique to the semiconductor device under test, comprising:
    a common pattern generation means for generating test patterns for testing said common function modules in said semiconductor device under test;
    a plurality of specific pattern generation means for generating test patterns for testing said specific function modules in said semiconductor device under test; and
    a pattern combine circuit which is connected to the outputs of said common pattern generation means and said specific pattern generation means and transmits said test patterns from either one of said common pattern generation means or said plurality of said specific pattern generation means;
    wherein said common pattern generation means sends a start signal to selected one of said specific pattern generation means to initiate the operation of generating the module specific test pattern by said selected specific pattern generation means, and said selected specific pattern generation means sends an end signal to said common pattern generation means to initiate the operation of said common pattern generation means.

11. A pattern generator as defined in claim 10, wherein said common pattern generation means suspends its operation after sending said start signal to said selected specific pattern generation means.

12. A pattern generator as defined in claim 10, wherein said selected specific pattern generation means suspends its operation after sending said end signal to said common pattern generation means.

13. A pattern generator as defined in claim 10, wherein said common pattern generation means includes a sequence control memory which stores instructions for controlling the test pattern generation, and a test and expected pattern memory which stores pattern data and expected data for generating the test pattern to be supplied to the device under test and expected pattern to be supplied to a logic comparator to compare the output signal of the device under test with said expected pattern, said sequence control memory storing an instruction for generating said start signal to be supplied to one of said specific pattern generation means when a predetermined task of said common pattern generation means has been finished.

14. A pattern generator as defined in claim 10, wherein each of said specific pattern generation means includes a sequence control memory which stores instructions for controlling the test pattern generation, and a test and expected pattern memory which stores pattern data and expected data for generating the test pattern to be supplied to the device under test and the expected pattern to be supplied to a logic comparator to compare the output signal of the device under test with said expected pattern, said sequence control memory storing an instruction for generating said end signal to be supplied to said common pattern generation means when a predetermined task of said specific pattern generation means has been completed.

15. A pattern generator to be used in a semiconductor test system for testing a semiconductor device having function modules common to other semiconductor devices and specific function modules unique to the semiconductor device under test, comprising:

a common pattern generation means for generating test patterns for testing said common function modules in said semiconductor device under test;

a plurality of specific pattern generation means for generating test patterns for testing said specific function modules in said semiconductor device under test;

a pattern combine circuit which is connected to the outputs of said common pattern generation means and said specific pattern generation means and transmits said test patterns from either one of said common pattern generation means or said plurality of said specific pattern generation means;

a selector provided between said common pattern generation means and said specific pattern generation means to selectively form a communication path between said common pattern generation means and one of said specific pattern generation means; and a register for supplying select data for defining said communication path by said selector;

wherein said common pattern generation means sends a start signal to selected one of said specific pattern generation means through said communication path formed by said selector to initiate the operation of generating the module specific test pattern by said selected specific pattern generation means, and said selected specific pattern generation means sends an end signal to said common pattern generation means through said communication path formed by said selector to initiate the operation of said common pattern generation means.

16. A pattern generator as defined in claim 15, wherein said common pattern generation means suspends its operation after sending said start signal to said selected specific pattern generation means.

17. A pattern generator as defined in claim 15, wherein said selected specific pattern generation means suspends its operation after sending said end signal to said common pattern generation means.

18. A pattern generator as defined in claim 15, wherein said common pattern generation means includes a sequence control memory which stores instructions for controlling the test pattern generation, and a test and expected pattern memory which stores pattern data and expected data for generating the test pattern to be supplied to the device under test and expected pattern to be supplied to a logic comparator to compare the output signal of the device under test with said expected pattern, said sequence control memory storing an instruction for generating said start signal to be supplied to one of said specific pattern generation means when a predetermined task of said common pattern generation means has been finished.

19. A pattern generator as defined in claim 15, wherein each of said specific pattern generation means includes a sequence control memory which stores instructions for controlling the test pattern generation, and a test and expected pattern memory which stores pattern data and expected data for generating the test pattern to be supplied to the device under test and the expected pattern to be supplied to a logic comparator to compare the output signal of the device under test with said expected pattern, said sequence control memory storing an instruction for generating said end signal to be supplied to said common pattern generation means when a predetermined task of said specific pattern generation means has been completed.

* * * * *